(12) United States Patent
Saito

(10) Patent No.: US 12,204,286 B2
(45) Date of Patent: Jan. 21, 2025

(54) SOLAR PANEL, DISPLAY DEVICE, AND TIMEPIECE

(71) Applicant: CASIO COMPUTER CO., LTD., Tokyo (JP)

(72) Inventor: Yuta Saito, Tachikawa (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 809 days.

(21) Appl. No.: 16/980,008

(22) PCT Filed: Jan. 23, 2019

(86) PCT No.: PCT/JP2019/001952
§ 371 (c)(1),
(2) Date: Sep. 11, 2020

(87) PCT Pub. No.: WO2019/176293
PCT Pub. Date: Sep. 19, 2019

(65) Prior Publication Data
US 2021/0255587 A1  Aug. 19, 2021

(30) Foreign Application Priority Data
Mar. 14, 2018 (JP) ................ 2018-046098

(51) Int. Cl.
*G04G 19/02* (2006.01)
*G04B 19/06* (2006.01)
(Continued)

(52) U.S. Cl.
CPC .......... *G04C 10/02* (2013.01); *G04B 19/065* (2013.01); *G04B 19/247* (2013.01); *G04G 19/02* (2013.01); *G04G 19/10* (2013.01); *G04G 19/12* (2013.01)

(58) Field of Classification Search
CPC ........ G04C 10/02; G04G 19/00; G04G 19/10; G04G 19/02; G04G 19/12; G04G 19/247;
(Continued)

(56) References Cited

U.S. PATENT DOCUMENTS 2,282,209 A * 5/1942 Pepper, Jr. ........... G04B 45/046
968/211
5,912,064 A * 6/1999 Azuma .................. G04C 10/02
136/251
(Continued)

FOREIGN PATENT DOCUMENTS

JP S62232175 A 10/1987
JP H05150055 A 6/1993
(Continued)

OTHER PUBLICATIONS

Chinese Office Action dated Jan. 19, 2023 (and English translation thereof) issued in counterpart Chinese Application No. 202210078927.1.

(Continued)

*Primary Examiner* — Sean Kayes
(74) *Attorney, Agent, or Firm* — Holtz, Holtz & Volek PC

(57) ABSTRACT

A solar panel includes a plurality of solar cells. Each of the solar cells includes a plurality of power generation regions, and connection regions that connect the plurality of power generation regions and have a lower power generation capacity than the plurality of power generation regions. A plurality of power generation functional units are formed in which the connection regions are disposed adjacent to each other.

11 Claims, 6 Drawing Sheets

(51) Int. Cl.
*G04B 19/247* (2006.01)
*G04C 10/02* (2006.01)
*G04G 19/10* (2006.01)
*G04G 19/12* (2006.01)

(58) Field of Classification Search
CPC ...... G04B 19/06; G04B 19/12; G04B 19/065; H01L 31/05
See application file for complete search history.

(56) References Cited

U.S. PATENT DOCUMENTS

| | | | | |
|---|---|---|---|---|
| 5,990,995 | A * | 11/1999 | Ebihara | G02F 1/133553 349/86 |
| 6,466,522 | B1 * | 10/2002 | Yoshioka | G04B 19/32 368/205 |
| 6,791,905 | B1 * | 9/2004 | Sekiguchi | G04C 10/02 368/80 |
| 7,746,731 | B2 * | 6/2010 | Murakami | H01L 31/0488 136/251 |
| 2002/0157700 | A1 * | 10/2002 | Ito | G04C 10/02 257/E31.038 |
| 2009/0129210 | A1 * | 5/2009 | Yamaguchi | H01L 31/02167 368/205 |
| 2012/0252373 | A1 * | 10/2012 | Saito | G04R 60/10 455/73 |
| 2014/0247705 | A1 * | 9/2014 | Saito | G04G 17/06 368/205 |
| 2014/0293758 | A1 * | 10/2014 | Fleury | G04G 21/08 368/205 |
| 2017/0023915 | A1 * | 1/2017 | Sawada | G04C 10/02 |
| 2017/0038743 | A1 | 2/2017 | Sawada | |
| 2019/0094384 | A1 * | 3/2019 | Baba | G04R 20/04 |

FOREIGN PATENT DOCUMENTS

| | | |
|---|---|---|
| JP | 2011174948 A | 9/2011 |
| JP | 2015175602 A | 10/2015 |
| JP | 2017026454 A | 2/2017 |
| JP | 2017036960 A | 2/2017 |

OTHER PUBLICATIONS

International Preliminary Report on Patentability (IPRP) (and English language translation thereof) dated Sep. 15, 2020 issued in International Application No. PCT/JP2019/001952.
Extended European Search Report (EESR) dated Nov. 2, 2021, issued in European Application No. 19767151.4.
International Search Report (ISR) (and English translation thereof) dated Mar. 26, 2019 issued in International Application No. PCT/JP2019/001952.
Japanese Office Action (and English translation thereof) dated Aug. 6, 2019 issued in Japanese Application No. 2018-046098.
Japanese Office Action (and English translation thereof) dated Jan. 21, 2020 issued in Japanese Application No. 2018-046098.
Written Opinion dated Mar. 26, 2019 issued in International Application No. PCT/JP2019/001952.
Communication Pursuant to Article 94(3) EPC dated Jan. 4, 2024, issued in counterpart European Application No. 19767151.4.

* cited by examiner

SOLAR PANEL, DISPLAY DEVICE, AND TIMEPIECE

TECHNOLOGICAL FIELD

The present invention relates to a solar panel, a display device and a timepiece.

BACKGROUND ART

Conventionally, known timepieces include solar panels that receive light to generate power. In such a timepiece, a solar panel generates power to charge a secondary battery. It allows the battery to be used for a long time without replacement.

For example, a watch or the like provided with a solar panel does not require battery replacement. It is a convenient watch that is easy to handle for users.

However, since the solar panel is usually disposed below a dial, a material of which the dial is made is limited to plastics or the like having optical transparency to transmit light to the solar panel. It has been devised to express texture of metal by applying a coating or the like to this.

The solar panel is a sheet in dark purple or the like. A solar panel visible through a dial is undesirable in design. Therefore, dark color coating may be applied to the dial such that an original color of the solar panel is not visible through the dial. However, it darkens the surface of the dial and makes it hard to be read. It also spoils the beauty.

In view of this, for example, in Patent Document 1 discloses a configuration in which a prism is provided on the lower surface of a transparent dial and a semitransparent reflector is provided on the lower side of the prism to maintain optical transparency for the solar panel while brightening the surface of the dial to keep beautiful appearance.

PRIOR ART DOCUMENT

Patent Document

Patent Document 1: JP 2011-174948 A

SUMMARY OF THE INVENTION

Problems to be Solved by the Invention

However, the configuration described in Patent Document 1 requires complicated and delicate techniques, such as applying various surface processing such as painting on plastics or the like, to achieve beautiful appearance of the dial. Cost and effort for arranging the prism, etc. are required, which raises the overall product price.

Furthermore, even if plastics having optical transparency are coated or so, it is difficult to completely reproduce the same luxurious look as a dial made of various luxurious materials, such as actual metal and ceramics. It is a problem.

The present invention has been made in view of the above circumstances. It is an object of the present invention to provide a solar panel, a display device, and a timepiece that efficiently generate power and realize beautiful appearance without any special processing or the like on a dial side when installed in a timepiece or the like.

Means for Solving Problems

To achieve at least one of the abovementioned objects, according to an aspect of the present invention, a solar panel includes a solar cell, wherein the solar cell includes:

power generation areas; and
a connection area which connects the power generation areas and which generates a smaller amount of power than the power generation areas generate.

Advantageous Effects of Invention

The present invention achieves advantageous effect that power is efficiently generated and beautiful appearance is realized without performing special processing or the like on a dial side when installed in a timepiece or the like.

EMBODIMENTS FOR CARRYING OUT THE INVENTION

An embodiment of a solar panel according to the present invention and a timepiece as a display device to which the solar panel is applied will be described with reference to FIG. 1 to FIG. 5D.

Although various limitations which are technically preferred for carrying out the present invention are given to the embodiments described below, the scope of the present invention is not limited to the following embodiments and examples shown in figures.

Figure 1:
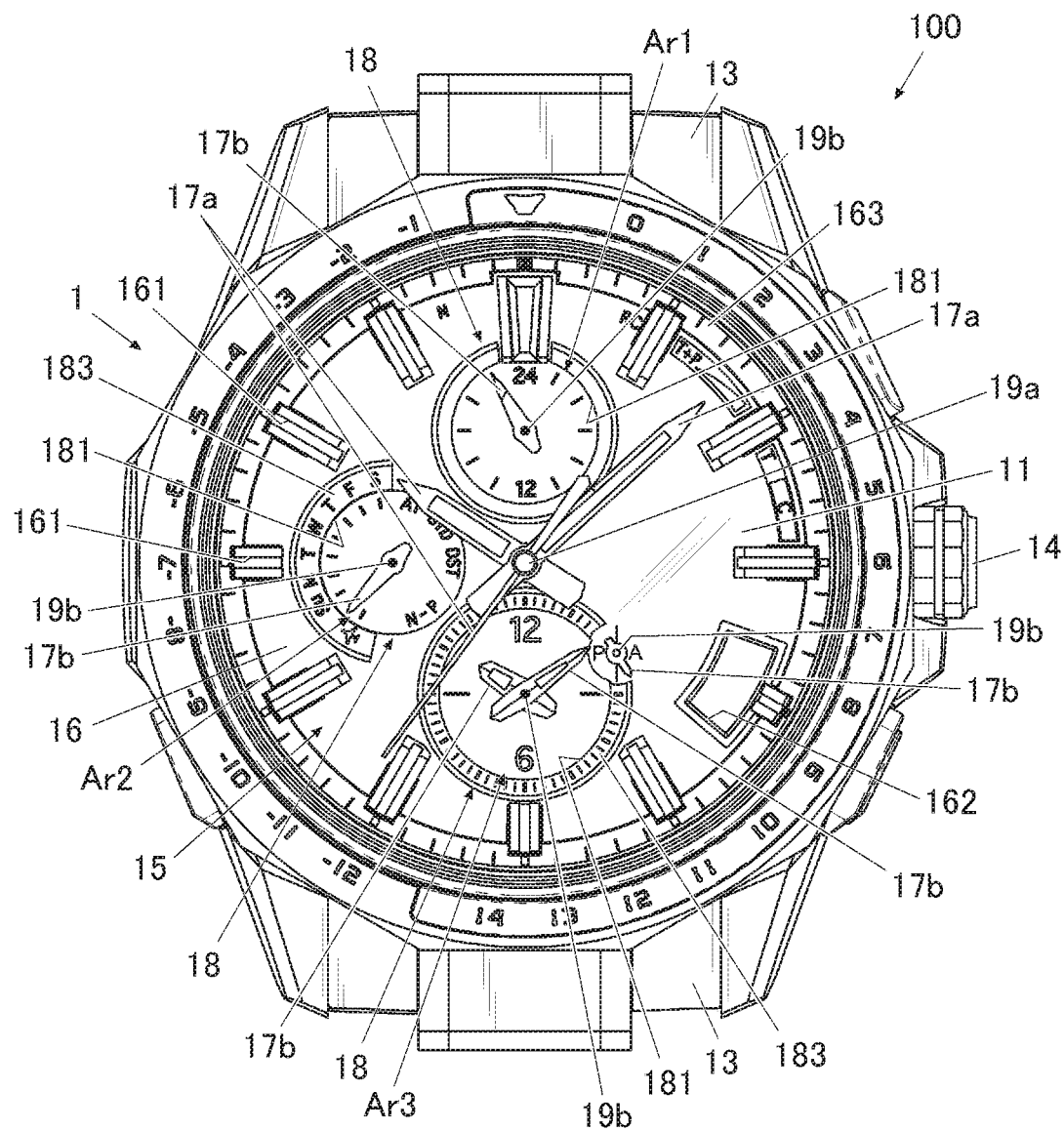
FIG. 1 is a front view of a timepiece according to an embodiment.

FIG. 1 is a front view showing the timepiece as the display device according to the embodiment.

As shown in FIG. 1, the timepiece 100 of the embodiment includes a case (hereinafter, referred to as "timepiece case 1" in the embodiment). The timepiece case 1 is made of, for example, metal such as stainless steel or titanium, ceramics, various synthetic resin, or the like. Materials of which the timepiece case 1 is made are not limited to those exemplified here.

The timepiece case 1 in the embodiment has a shape of a hollow short column. A protection cover 11 made of transparent glass or the like is attached to the front side of the timepiece 100 (the display side of the timepiece). A back cover (not shown) is attached to the back side of the timepiece 100.

A band connector 13 is provided at both upper and lower ends of the timepiece case 1 in FIG. 1, that is, at the end on the twelve o'clock side and at the end on the six o'clock side in the analog timepiece. A timepiece band (not shown) is attached to the band connector 13.

The timepiece 100 is provided with an operation button (crown in the embodiment) on a side or the like of the timepiece case 1.

The timepiece 100 (display device) includes:
a display 15 including a dial 16 (display board);
a module 2 disposed under the dial 16; and
a solar panel 5 disposed between the dial 16 and the module 2.

The solar panel 5 includes a power generation function to generate power by receiving light as described later. Generated power obtained from photovoltaic generation by the solar panel 5 is stored in a secondary battery.

A display 15 including the dial 16, the module 2, and the solar panel 5 are accommodated in the timepiece case 1.

The module 2 includes:
a timepiece movement (not shown) which is constituted by a motor, a wheel train mechanism, and the like that rotate main hands 17*a* and sub hands 17*b* described later;
a base plate (not shown) on which various electronic components and the like are mounted; and
a secondary battery (not shown) that supplies power to functional units of the timepiece 100.

A hand shaft 19*a* to which the main hands 17*a* are attached and a hand shaft 19*b* to which the sub hands 17*b* are attached protrude from the module 2. They penetrate the dial 16 and the solar panel 5 to protrude above the dial 16 and the solar panel 5.

As the hand shaft 19*a* rotates about the axis, the main hands 17*a* are rotated above the dial 16 and the solar panel 5. As the hand shaft 19*b* rotates about the axis, the sub hands 17*b* are rotated above the dial 16 and the solar panel 5.

Rotation of the main hands 17*a* and the sub hands 17*b* preferably stops in a sleep mode (power saving mode to suppress power consumption). At least the main hands 17*a* among the hands preferably stop at a position where it does not overlap the power generators 6 (6*a*-6*c*) of the solar panel 5, which will be described later, in the sleep mode.

When the hands stop above the power generators 6 (6*a*-6*c*), the hands cast shadows on the power generators 6 (6*a*-6*c*). The shadows reduce power generation efficiency of the power generators 6 (6*a*-6*c*). Since the main hands 17*a* among the hands are longer and wider than the sub hands 17*b*, they greatly influence power generation efficiency of the power generators 6 (6*a*-6*c*). Shifting stop positions of the main hands 17*a* in the sleep mode from positions above the power generators 6 (6*a*-6*c*) contribute to maintenance and improvement in power generation efficiency.

In the embodiment, bosses 22 for positioning protrude from the upper rim of the module 2 respectively on the twelve o'clock side and on the six o'clock side of the analog timepiece. The bosses 22 are locked in locking hollows 71 provided on the solar panel side, as will be described later.

A protrusion 23 for positioning which protrudes in the thickness direction of the timepiece is formed on the upper rim of the module 2 on the nine o'clock side of the analog timepiece. The protrusion 23 is locked in a cut-out 72 provided on the solar panel side, as will be described later.

A base plate (not shown) is mounted on the module 2. For example, a spring connector 24 (24*a*, 24*b*; see FIG. 2) is disposed at a position connecting a terminal (not shown) of the base plate for the solar panel and a terminal (52*a*, 52*b*; see FIGS. 2 and 3) of the solar panel 5.

Figure 2:
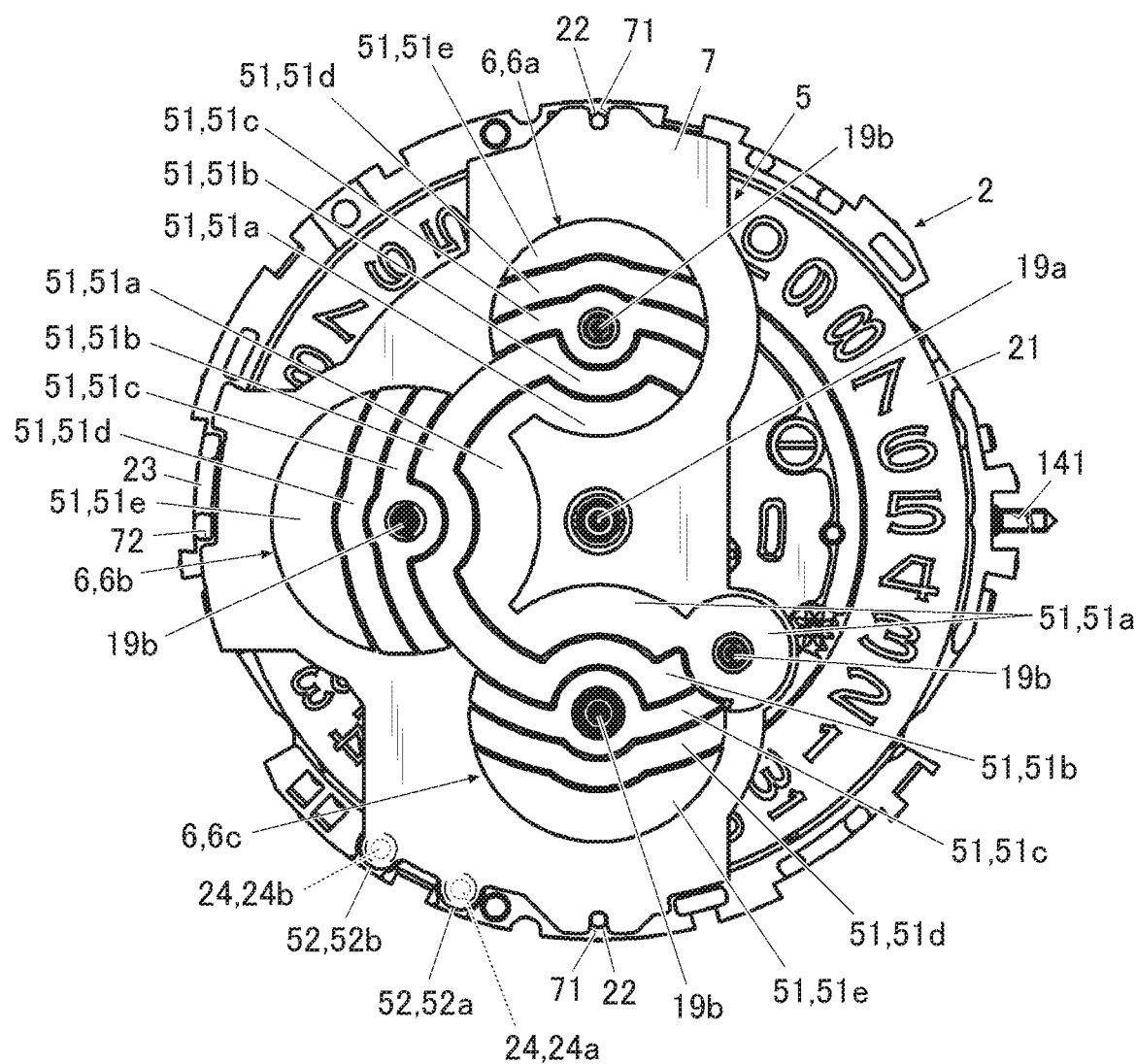
FIG. 2 is a plan view illustrating an example in which a module, a solar panel, and the like are installed in the timepiece shown in FIG. 1.

The timepiece 100 is provided with a ring-shaped dial cover 163 covering the rim of the dial 16. In the embodiment, as shown in FIG. 2, the terminal 52 of the solar panel 5 which is electrically connected to the terminal (not shown) of the base plate for the solar panel is disposed at the rim of the module 2. Therefore, the connector 24 is also disposed under the dial cover 163.

A spring connector 24 pushes up the solar panel 5 toward the display side from the module 2 side. Therefore, if the dial 16 has optical transparency, a pressure mark due to the connector 24 is visible through the display side of the dial 16. It spoils the beauty of the timepiece 100. However, in a case in which the connector 24 is positioned under the dial cover 163 as shown in the embodiment, the dial cover 163 covers the pressure mark even if the pressure mark appears due to the connector 24. The beauty of the timepiece 100 is not spoiled.

In the embodiment, the dial 16 is made of metal or the like that does not transmit light, as will be described later. Therefore, even if the connector 24 is disposed at a position away from the dial cover 163, the pressure mark caused by the connector 24 is not visible through the dial 16 from the display side. The connector 24 and the terminal of the base plate for the solar panel and the terminal 52 of solar panel 5 which are connected by the connector 24 can be arranged quite freely.

Because there is no need to hide the connector 24 with the dial cover 163, the dial cover 163 can be designed and positioned regardless of a position of the connector 24. Accordingly, for example, a configuration in which the dial cover 163 is made narrower to make the dial 16 visible in a wide range may be employed.

The display 15 is provided under the protection cover 11 in the timepiece case 1 as shown in FIG. 1.

As shown in FIG. 1, the display screen 15 in the embodiment is an analog display including a dial 16, main hands 17*a* including an hour hand, a minute hand, and a second hand disposed above the dial 16, and sub hands 17*b* such as various function hands.

In the embodiment, the dial 16 is made of a material that does not transmit light, such as metal and ceramics (not only a material that does not transmit light at all, but also a material that hardly transmits light).

Time letters 161 as a guide of time indicated by the main hands 17*a* (hour hand, minute hand, second hand) are arranged in the rim of the dial 16 on the front side.

In the timepiece 100 of the embodiment, as shown in FIG. 2, a ring-shaped date indicator 21 is disposed along the rim of the module 2 between the solar panel 5 and the module 2 (above the module 2 and below the solar panel 5). The date indicator 21 is a rotating body that has numbers or the like indicating dates along the circumferential direction. At a position corresponding to four o'clock in the analog timepiece, a window 162 is provided near the rim of the dial 16 to expose a date on the date indicator 21 to the display side (see FIG. 1). The arrangement and the like of the window 162 are not limited to the example shown in the figure. It is not essential to have the date indicator 21.

In the embodiment, the display 15 is provided with inner dials (small displays) 18 including functional hands which are the sub hands 17*b* and the like, in addition to the main display that displays time by the hour hand, the minute hand, and the second hand which are the main hands 17a.

The inner dial 18 displays, for example, time in a different city or region (e.g., the current time in New York, etc.) which is different from the main time displayed with the hour hand, the minute hand, and the second hand (e.g., the current time in Tokyo when using the timepiece 100 in Tokyo).

In the embodiment, around the hand shaft 19a to which the main hand 17a is attached, the inner dials 18 are provided respectively on the twelve o'clock side, the nine o'clock side, and the six o'clock side of the analog timepiece.

Portions of the dial 16 which correspond to faces of the inner dials 18 are the openings 181 as cut-outs each formed by cutting a portion of the dial 16.

Around the opening 181, a ring-shaped indicator ring 183 is provided to edge around the opening 181. Like the dial cover 163 in the timepiece 100, the indicator ring 183 may have scale or the like attached along the circumferential direction by printing, vapor deposition, typesetting, or the like. It is not essential to provide the indicator ring 183 around the opening 181. The indicator ring 183 may be omitted.

As previously mentioned, the dial 16 in the embodiment is made of a material that does not transmit light. The openings 181 provided in the inner dials 18 are the only portions that transmits light.

That is, the dial 16 includes highly transparent areas having high transparency and a less transparent area having lower optical transparency than the highly transparent areas have. In the embodiment, as shown in FIG. 1, the openings 181 provided in the three inner dials 18 are the highly transparent areas Ar1-Ar3. The part of the dial 16 other than the openings 181 is the less transparent area having lower optical transparency than the highly transparent areas Ar1-Ar3 have.

In the embodiment, as will be described later, the solar panel 5 is provided with power generators 6 (in the embodiment, power generators 6a-6c) having a power generation function of generating power by receiving light. The openings 181 of the inner dials 18, which are the highly transparent areas Ar1-Ar3, are disposed to correspond to areas where the power generators 6 are disposed in the solar panel 5.

The part other than the openings 181 is the less transparent area (in the embodiment, it has transmittance of substantially zero). Therefore, the portion of the solar panel 5 disposed at the position corresponding the portion other than the openings 181 is shielded from light.

A solar panel 5 is disposed below the dial 16 and above the module 2 and the date indicator 21 disposed thereon.

FIG. 2 shows an example in which a solar panel is installed in a timepiece, and is a plan view showing a state in which the solar panel is disposed above the module and the date indicator.

Preferably, a support seat 25 (see FIG. 5A and FIG. 5B) is disposed between the module 2 and the date indicator 21 and the solar panel 5 to prevent the solar panel 5 from contacting directly with the surfaces of the module 2 and the date indicator 21 and from being damaged by rubbing against each other.

As shown in FIG. 2, the solar panel 5 has substantially the same length as the diameter of the module in the direction from twelve o'clock to six o'clock (hereinafter referred to as "longitudinal direction") when installed in the timepiece 100. The end portion in the protruding direction protruding perpendicular to the longitudinal direction in the surface toward nine o'clock in the timepiece is disposed substantially at the same position as the end portion of the module 2 on the nine o'clock side.

The solar panel 5 is provided with a through hole 53a into which the hand shaft 19a is inserted at a position corresponding to the hand shaft 19a. A through hole 53b into which the hand shaft 19b is inserted is provided at a position corresponding to the hand shaft 19b provided in each of the inner dials 18.

The solar panel 5 includes:
  the power generators 6 which consist of solar cells 51 and which has the power generation function of generating power by receiving light;
  a connector 55 that electrically connects the power generators 6 with each other; and
  a connector 56 that electrically connects the solar cells 51, which constitute the power generators 6, with each other.

Figure 3:
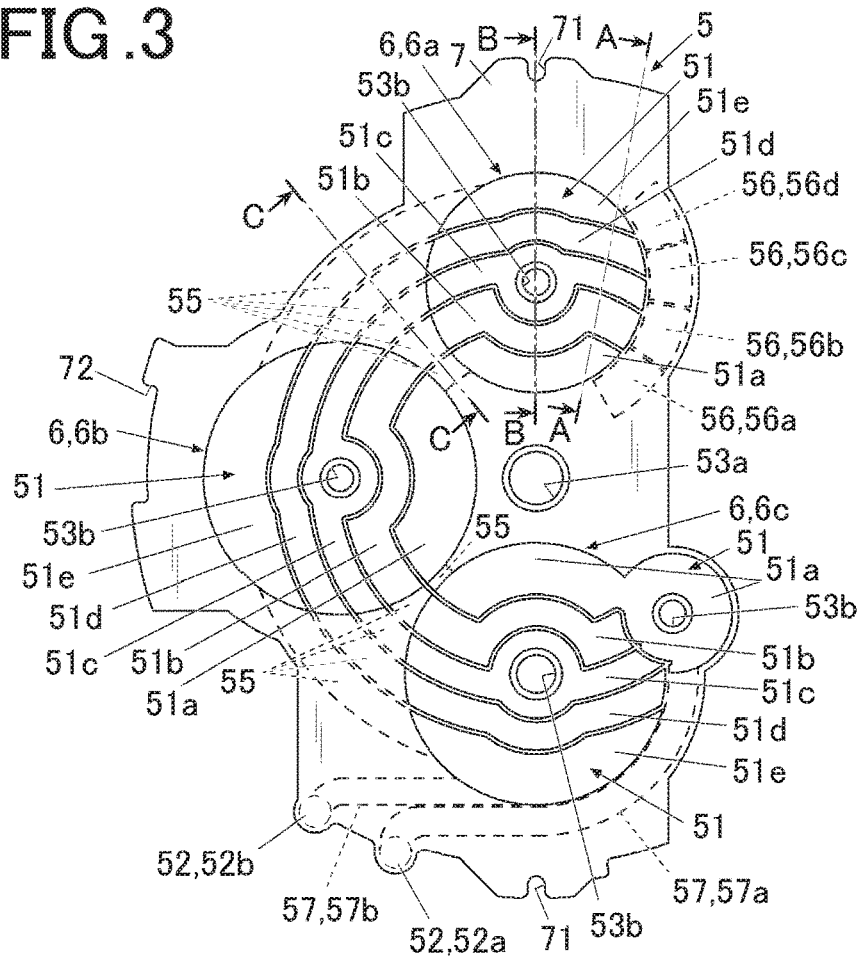
FIG. 3 is a plan view of a solar panel according to the embodiment.

FIG. 3 is a plan view of the solar panel of the embodiment.

As shown in FIGS. 2 and 3, the solar panel 5 of the embodiment includes:
  the three power generators 6a-6c that consist of five divided solar cells 51a-51e;
  the connector 55 that electrically connects the power generators 6a-6c with each other; and
  connectors 56a-56d that electrically connect the solar cells 51a-51e, which constitute the power generators 6a-6c, with each other.

Each of the solar cells 51a-51e includes a power generation area corresponding to the three power generators 6a-6c and a connection area corresponding to the connector 55.

That is, the solar cell 51e is a solar cell including:
  a power generation area corresponding to the power generator 6a;
  a connection area corresponding to the connector 55;
  a power generation area corresponding to the power generator 6b;
  a connection area corresponding to the connector 55; and
  a power generation area corresponding to the power generator 6c.

Other solar cells 51a to 51d have the same configuration.

The number of solar cells 51 provided in the solar panel 5 is not limited to five and may be more or less.

The number of power generators 6 provided in the solar panel 5 is not limited to three and may be more or less.

The arrangement, shape, number, and the like of the power generator 6 are set in accordance with the arrangement, shape, number, and the like of the highly transparent area of an equipment in which the power generator 6 is installed (in the embodiment, the highly transparent areas Ar1-Ar3 of the dial 16).

For example, if a secondary cell can achieve a full charge by generating power in an environment of 500Lx, the power generator 6 having substantially the same area as that of the highly transparent area (in the embodiment, the highly transparent areas Ar1-Ar3 which is the openings 181 of the dial 16) generates power by receiving light to produce a voltage equivalent to 500Lx. Thus, a voltage sufficiently larger than the full charge voltage of the secondary battery is obtained. In contrast, if the power generator 6 having an area larger than that of the highly transparent area generates power by receiving light, power generation efficiency is reduced. For example, only a voltage of about 50Lx is obtained. It is difficult to exceed the full charge voltage of the secondary battery.

Therefore, it is preferable that the arrangement, shape, and the like of the power generator 6 matches with the arrangement, shape, and the like of the highly transparent area of an equipment in which the power generator is installed as much as possible.

In the embodiment, the highly transparent areas Ar1-Ar3, which is the opening 181 of the dial 16, and the power generators 6a-6c of the solar panel 5 are designed to have substantially the same arrangement and shape.

The power generators 6a-6c of the solar panel 5, when installed in the timepiece 100, is exposed from the openings 181 of the dial, which are cut-outs, to sufficiently receive light to generate power.

The portion of the solar panel 5 where the solar cells 51a-51e and the connectors 55, 56 are not provided is a non-power generator 7 that does not contribute to power generation.

The non-power generator 7 positions and fixes the solar panel 5 when the solar panel 5 is installed in an equipment.

In the embodiment, the bosses 22 are provided in the module 2 on the twelve and six o'clock sides of the analog timepiece as previously described. Correspondingly, locking hollows 71 are formed in the non-power generator 7 of the solar panel 5 at positions corresponding to the bosses 22.

The protrusion 23 protruding in the thickness direction of the timepiece is provided in the module 2 on the nine o'clock side of the analog timepiece. The cut-out 72 shaped to fit the protrusion 23 is formed in the non-power generator 7 of the solar panel 5 at a position corresponding to the protrusion 23.

The solar panel 5 is disposed on the module 2 so that the bosses 22 fit into the locking hollows 71 and the protrusion 23 fits into the cut-out 72. Thus, the solar panel 5 is positioned in the rim of the module 2 on at least three points and is fixed to and supported by the module 2.

According to this configuration, the solar panel 5 is disposed to bridge over the date indicator 21 disposed above the module 2. Even if some warp or bend appears in the solar panel 5, it does not touch or interfere with the surface of the date indicator 21.

The entire shape of the solar panel 5 is not limited to the example shown in the figure, and is appropriately set in accordance with the shape of an equipment (the timepiece 100 in the embodiment) in which the solar panel 5 is installed and with mounting status.

Reducing the size of the non-power generator 7, which does not contribute to power generation, as much as possible makes the entire solar panel 5 smaller and lighter. However, since the solar panel 5 is a sheet-like member that tends to cause warp or bend, it is preferable to have a minimal area required for fixation or the like to an equipment in which it is installed to realize stable installation.

The embodiment includes:
portions in which the solar cells 51a-51e constitute the power generators 6a-6c; and
portions that serve as the connectors 55 that connect the power generators 6a-6c with each other.

As shown in FIG. 3, the solar cells 51a-51e are connected across the power generators 6a-6c through connection areas corresponding to the connectors 55.

The solar cells 51a-51e are connected in series to serve as a single solar panel.

Specifically, the solar cell 51a is electrically connected to the adjacent solar cell 51b at the connector 56a. The solar cell 51b is electrically connected to the adjacent solar cell 51c at the connector 56b. The solar cell 51c is electrically connected to the adjacent solar cell 51d at the connector 56c. The solar cell 51d is electrically connected to the adjacent solar cell 51e at the connector 56d.

The solar panel 5 includes:
a terminal 52a on the side of the solar cell 51a which is connected to the solar cell 51a via a connector 57a; and
a terminal 52b on the side of the solar cell 51e which is connected to the solar cell 51e via a connector 57b.

When the solar panel 5 is installed in an equipment, the terminal 52a on the side of the solar cell 51a is electrically connected to a positive electrode on a base plate (not shown) via the connector 24a. The terminal 52b on the side of the solar cell 51e is electrically connected to a negative electrode on the base plate (not shown) via the connector 24b (see FIG. 2).

Thus, the five solar cells 51a-51e are connected in series and are electrically connected to the base plate.

The positions and shapes of the connectors 55, 56a-6d, terminals 52a, 52b, connectors 57a, 57b, and the like are not limited to the example shown in figures.

The positions of electrical connections between the solar panel 5 and the base plate, i.e., the positions of the two electrodes and the two connectors 24a, 24b on the base plate (not shown) are not particularly limited as long as the positions of the five solar cells 51a-51e are electrically connected to the base plate while being connected in series. For example, it may be on the solar cell 51c or on the solar cell 51d.

Each of the power generators 6a-6c is divided into five solar cells 51a-51e. This distributes effect of shadows casted on the power generators 6a-6c by the main hands 17a and the sub hands 17b, which are rotated above the power generators 6a-6c. It reduces effect of shadows of the hands on power generation efficiency as much as possible.

The manner of dividing the solar cell 51 is not limited to the one exemplified herein. The solar cell 51 may be divided into various shapes to reduce effect of shadows of the hands on power generation efficiency.

When output currents of the five solar cells 51a-51e are different from each other, an output current value of the three power generator 6a-6c as a whole is reduced in accordance with the solar cell 51 with the smallest output current value.

In order to increase power generation efficiency as much as possible, it is preferable that areas of the solar cell 51 in portions constituting the power generators 6a-6c are substantially the same so that output currents of the solar cells 51a-51e are substantially the same.

Figure 4A:
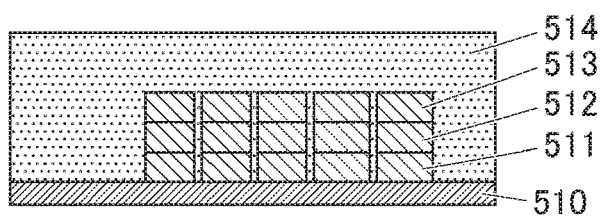
FIG. 4A is a cross-sectional view along A-A line in FIG. 3.
Figure 4B:
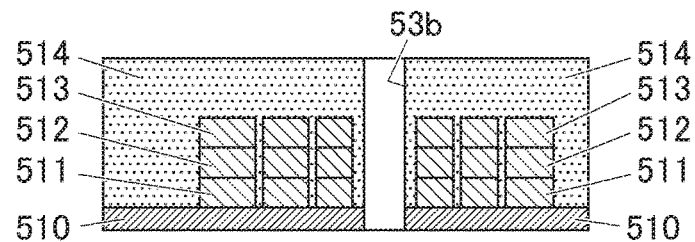
FIG. 4B is a cross-sectional view along B-B line in FIG. 3.

FIGS. 4A, 4B, and C are cross-sectional views respectively along A-A line, B-B line, and C-C line in FIG. 3.

As shown in FIG. 4A, the power generator 6 in the solar panel 5 has a layer structure in which a back electrode 511 is formed on the base 510, and a semiconductor layer 512 and a transparent electrode 513 are piled thereon in this order. A seal (protective layer) 514 is provided to cover the entire layer structure.

In the non-power generator 7 outside the power generator 6, only the seal 514 is provided on the base 510. The non-power generator 7 is a portion that does not contribute to power generation and may be made smaller, depending on the shape of an equipment in which the solar panel 5 is installed.

The base 510 is a flexible film-like base plate. Although there is no particular limitation on a material of the base 510, it is made of, for example, plastic or the like.

The back electrode 511 is made of a material including a metallic material such as an aluminum conductor. A material of the back electrode 511 is not limited thereto.

The semiconductor layer 512 is made of, for example, amorphous silicon (a-Si:H) or the like. The semiconductor layer 512 may be, for example, a pn junction type semiconductor in which a p-type semiconductor and an n-type semiconductor are joined.

The back electrode 511 and the semiconductor layer 512 are piled on the base 510 by, for example, vapor deposition or the like. The method of providing the back electrode 511 and the semiconductor layer 512 on the base 510 is not limited thereto.

The transparent electrode 513 is formed by, for example, crystallizing zinc oxide, indium oxide, tin oxide, or the like on a base plate made of glass or the like. A material and a method of forming the transparent electrode 513 is not limited thereto.

The seal 514 is made of an insulating material. The thicknesses of the power generator 6 and other portions are adjusted by changing the amount of seal 514 (thickness of the seal 514) so that the thickness of the solar panel 5 is substantially the same throughout the whole. Materials and methods of forming of the seal 514 are not particularly limited.

The through hole 53b is provided at the substantial center of each of the power generators 6a-6c in the solar panel 5. The hand shaft 19b of the hands (functional hand) 17b, which will be described later, is inserted into the through hole 53b. FIG. 4B shows a cross section (cross section along B-B line) of the portion where the through hole 53b is formed in the power generator 6a.

As shown in FIG. 4B, the through hole 53b of the power generator 6a penetrates all of the base 510, the back electrode 511, the semiconductor layer 512, the transparent electrode 513, and the seal 514. The seal 514 is provided also on the inside of the through hole 53b. The seal 514 covers and insulates edges of the back electrode 511, the semiconductor layer 512, and the transparent electrode 513 so that they are not exposed inside the through hole 53b.

Figure 4C:
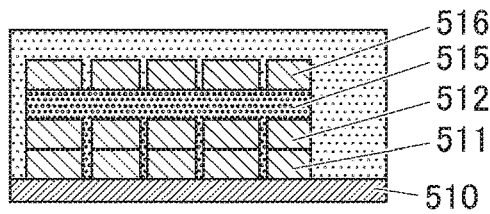
FIG. 4C is a cross-sectional view along C-C line in FIG. 3.

FIG. 4C shows a cross section (cross section along C-C line) of a portion where the connector 55 is provided.

As shown FIG. 4C, in the portion where the connector 55 is provided (that is, a portion that "does not have a power generation function" described later), processing of removing the transparent electrode 513 among the base 510, the back electrode 511, the semiconductor layer 512, the transparent electrode 513, and the seal 514 constituting the power generator 6a is performed. A conductor layer 516 is disposed in place of the transparent electrode 513. An insulating layer 515 is provided between the semiconductor layer 512 and the conductor layer 516. In the portion where the connector 55 is provided (i.e., the portion that "does not have the power generation function" described later), as shown in the solar panel 5 of FIG. 2, the solar cells 51a, 51b may have a configuration like FIG. 4A, and the solar cells 51c-51e may have a configuration like FIG. 4C.

A method of removing the transparent electrode 513 is not particularly limited. For example, processing with a laser or the like is performed. In the portion where the connector 55 is provided, not only the transparent electrode 513 but also the back electrode 511 and the semiconductor layer 512 may be removed.

A specific material and a method of forming the insulating layer 515 are not particularly limited as long as it is a layer made of an insulating material.

The conductor layer 516 may be made of a variety of conductive materials. A specific material and a forming method are not particularly limited.

Although not shown, the connectors 56a-56d have a configuration like the one shown in FIG. 4C.

In the embodiment, the connectors 55 and the connectors 56a-56d both do not have a power generation function. The connector 55 connects the solar cells 51a-51e constituting the power generators 6a-6c with each other respectively for the solar cells 51a-51e. The connectors 56a-56d connect the solar cells 51a-51e with each other.

The phrase "does not have the power generation function" have meaning including:
  a case in which the connectors 55 and the connectors 56a-56d do not have a mechanism for generating power by receiving light;
  a case in which the connectors 55 and the connectors 56a-56d are shielded from light so as not to receive light although these connectors have a mechanism for generating power by receiving light; and
  a case in which the connectors 55 and the connectors 56a-56d have very small areas so that they do not substantially function as power generators and do not affect power generation efficiency of the power generators.

Accordingly, in each of the solar cells, a power generation amount in the connection areas corresponding to the connectors that connect the power generation areas corresponding to the power generators is smaller than a power generation amount in the power generation areas.

In the embodiment, the transparent electrode 513 is removed in the connectors 55 and the connectors 56a-56d to have the configuration shown in FIG. 4C. Thereby the connectors 55 and the connectors 56a-56d have a configuration that does not include a mechanism for generating power by receiving light.

If the dial 16 is made of a material that does not transmit light as in the embodiment, the portion other than the openings 181 is disposed under the dial 16 and is thereby shielded from light. Therefore, the portion below the dial 16 except the openings 181 does not function as a power generator even if the transparent electrode 513 is not removed. In the connectors 55 shown in the solar panel 5 of FIG. 2, the transparent electrode 513 is removed in the solar cells 51c-51e to have the configuration shown in FIG. 4C. Thereby they have a configuration that does not include a mechanism for generating power by receiving light. In the solar cells 51a and 51b, portions other than the openings 181 are disposed under the dial 16. The transparent electrode 513 is not removed and has the configuration shown in FIG. 4A. Thereby the connectors 55 become the portion that "does not have the power generation function".

In the embodiment, the three power generators 6a, 6b, 6c provided on the solar panel 5 are respectively provided at positions corresponding to the inner dials 18.

Figure 5A:
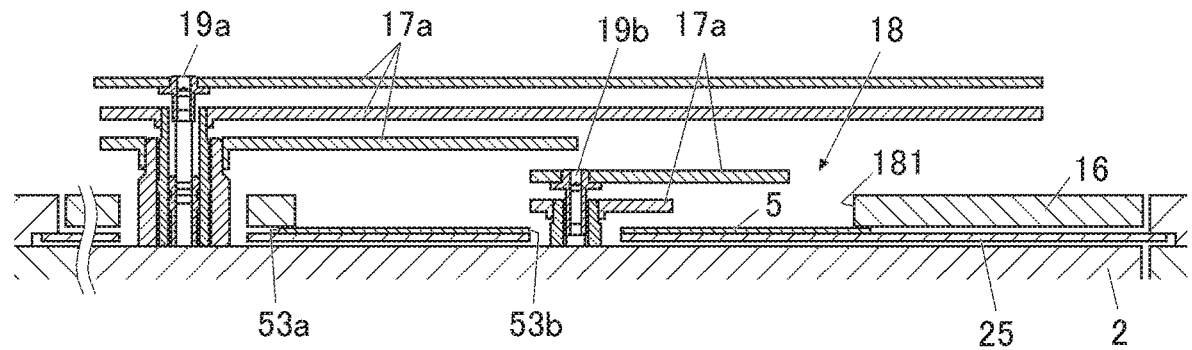
FIG. 5A is a cross-sectional view of an inner dial and the vicinity according to the embodiment.

FIG. 5A is a cross-sectional view of a main portion around the inner dial 18.

As shown in FIG. 5A, the opening 181 is formed at a portion in the dial 16 which corresponds to each inner dial 18. The power generators 6a, 6b, 6c of the solar panel 5 disposed below the dial 16 are exposed respectively from the openings 181 of the inner dials 18.

Although not shown in FIG. 5A, various sheets having optical transparency (e.g., decorative sheets on which designs of various small dials are printed, sheets on which only time letters are printed, etc.) may be put on the surfaces of the power generators 6a, 6b, 6c of the solar panel 5 which are exposed from the openings 181.

A scale, time letters, or the like may be provided in the rim of the openings 181 of the inner dial 18 while nothing is put on the surfaces of the power generators 6a, 6b, 6c of the solar panel 5.

Figure 5B:
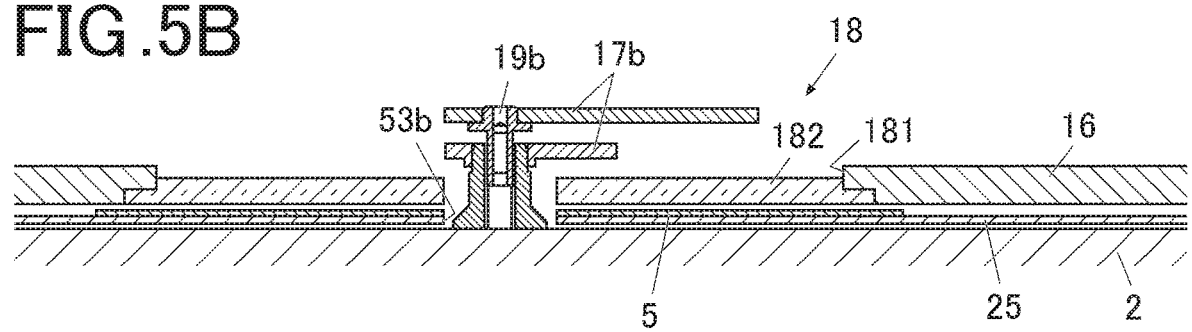
FIG. 5B is a cross-sectional view showing a configuration of a modification of the inner dial and the vicinity.

As shown in FIG. 5B, a transparent cover 182 may be fitted into the opening 181 of each inner dial 18 by press fit or the like. This prevents direct exposure of the power generators 6a, 6b, 6c of the solar panel 5. The transparent cover 182 is made of a transparent resin, glass (e.g., sapphire glass), or the like having an optical transparency. In this case, a design of a small dial, time letters, a scale or the like may be added by printing, vapor deposition, or the like on front and back sides of the transparent cover 182 within a range in which they do not inhibit optical transparency. Alternatively, time letters or the like may be planted.

A position-fixing member that positions and fixes the solar panel 5 may be provided on the dial 16.

Figure 5C:
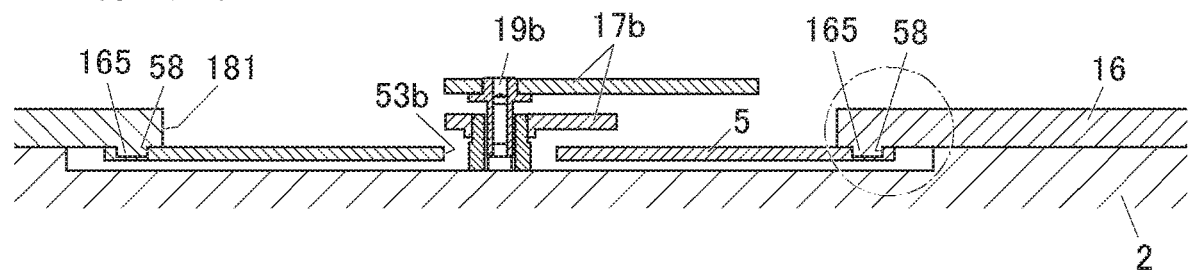
FIG. 5C is a cross-sectional view showing a configuration of a modification of the inner dial and the vicinity.

For example, as shown in FIG. 5C, in the rim of the opening 181 of the inner dial 18 in the dial 16, a boss 165 as the position-fixing member may protrude toward the solar panel 5 from the lower surface of the dial 16 while a locking portion 58 that receives the boss 165 is formed in the non-power generator 7 of the solar panel 5.

In this case, the boss 165 on the dial 16 is fitted or adhesively fixed to the locking portion 58 on the solar panel 5. Thus, the solar panel 5 is fixed to the dial 16 and is integrated with the dial 16.

Although FIG. 5C shows an example in which the locking portion 58 is a hollow, the locking portion 58 may be a hole penetrating in the thickness direction.

Figure 5D:
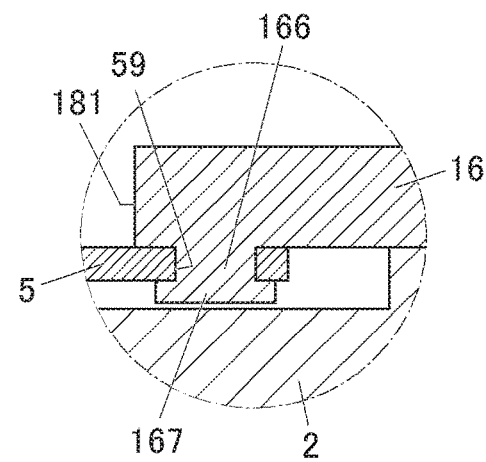
FIG. 5D is a cross-sectional view showing a modification of a portion surrounded by a dashed line in FIG. 5C.

For example, as shown in FIG. 5D, in a case in which the locking portion 59 is a hole, the boss 166 as the position-fixing member on the dial 16 may include a boss top 167 having an outer diameter larger than an inner diameter of the locking portion 59 which is the hole.

In this case, the boss top 167 of the boss 166 on the dial 16 is fitted to the locking portion 59 on the solar panel 5 by press-fitting or the like. Thus, the solar panel 5 is more reliably fixed to the dial 16 and is integrated with the dial 16.

In a case in which the solar panel 5 is integrated with dial 16 as shown in FIG. 5C and FIG. 5D, the solar panel 5 does not need to be positioned or fixed on the side of the module 2. Therefore, the boss 22, the protrusion 23, or the like may not be provided in the module 2.

Next, operation of the solar panel 5 and the timepiece 100 in the embodiment will be described.

In the embodiment, the solar panel 5 is disposed on the module 2 with the date indicator 21 disposed on the upper surface. The solar panel 5 is disposed on the module 2 so that the bosses 22 fit into the locking hollows 71 and the protrusion 23 fits into the cut-out 72. Thus, the solar panel 5 is positioned and fixedly supported on at least three points in the rim of the module 2.

The dial 16 is disposed above the solar panel 5. The highly transparent areas Ar1-Ar3, which are the openings 181 of the inner dial 18, are arranged to correspond to the power generators 6a-6c of the solar panel 5. The power generators 6a-6c are exposed from the openings 181.

Therefore, when light enters from the openings 181, the power generators 6a-6c efficiently performs photovoltaic power generation, and the power obtained by the power generation is stored in the secondary battery. The secondary battery supplies power to operation units of the module 2, such as a motor, to drive the timepiece 100.

According to the embodiment, the solar panel 5 includes the power generators 6a-6c and the connectors 55, 56. The power generators 6a-6c are constituted by the solar cells 51a-51e, and has the power generation function of generating power by receiving light. The connectors 55, 56 electrically connect the power generators 6a-6c and the solar cells 51a-51e, which constitute the power generators 6a-6c, with each other. Therefore, the entire solar panel 5 efficiently generates power without being affected by shadows of the hands 17a, 17b, and the like.

The connectors 55, 56 have no generation function and therefore do not affect power generation efficiency of the power generators 6a-6c.

In a case in which the solar panel 5 of the timepiece 100 of the embodiment is disposed between the dial 16 and the module 2, the dial 16 includes:
highly transparent areas Ar1-Ar3 having high optical transparency; and
a less transparent area having lower optical transparency than the highly transparent areas Ar1-Ar3 have.

The highly transparent areas Ar1-Ar3 are provided to correspond to areas where the power generators 6a-6c are disposed in the solar panel 5.

This increases power generation efficiency of the power generators 6a-6c.

The power generators 6a-6c are brought together in the highly transparent areas Ar1-Ar3 of dial 16. A material of which the dial 16 is made can be selected more freely (material without optical transparency may also be selected) as compared to a case in which the solar panel 5 having the same shape as the entire dial 16 is disposed in the entire area under the dial 16. Installation of the solar panel 5, the overall timepiece configuration, a design, and the like can be more freely determined.

Even in a case in which the solar panel 5 is installed in the timepiece 100, the power generators 6a-6c and the connectors 55, 56 can be included, the connectors 55, 56 electrically connecting the power generators 6a-6c and the solar cells 51a-51e, which constitute the power generators 6a-6c, with each other.

Also in this case, the connectors 55, 56 may not have a generation function so as not to affect power generation efficiency of the power generators 6a-6c.

In the embodiment, the highly transparent areas Ar1-Ar3 of the dial 16 are the openings 181 as cut-outs formed by cutting a portion of the dial 16. The power generators 6a-6c of the solar panel 5 are exposed from the opening 181.

Therefore, even when the dial 16 itself is made of a material that does not transmit light, such as metal or ceramics, sufficient power is generated.

As described above, in the embodiment, a material of which the dial 16 is made is not limited to a material that transmits light, such as polycarbonate. The dial 16 may be made of various materials including materials that do not transmit any light.

Therefore, it is possible to express luxurious look, to design freely, and the like without performing special processing, such as printing or vapor deposition, on the dial 16. A timepiece with excellent design is realized.

In a case in which the dial 16 is provided with bosses (the boss 165 in FIG. 5C and the boss 166 in FIG. 5D) as the position-fixing members that position and fix the solar panel 5, the solar panel 5 is positioned and fixed to the dial 16 by the position-fixing members.

In this case, since positioning or fixing on the module 2 is not required, the boss 22, the protrusion 23, and the like does not need be provided at positions corresponding to the shape or the like of the solar panel 5. The common module 2 can be applied to any design shape of the dial 16 and the solar panel 5 corresponding to the dial 16.

In the embodiment, the solar panel 5 is fixed to and supported by at least three points in the rim of the module 2 (in the embodiment, three points on the twelve o'clock side, the nine o'clock side, and the six o'clock side in the analog timepiece).

According to this configuration, even in a case in which the ring-shaped date indicator 21 along the rim of the module 2 is disposed between the solar panel 5 and the module 2, the solar panel 5 is positioned to bridge over the date indicator 21 disposed above the module 2. Even if some warp or bend appears in the solar panel 5, it neither touches nor interferes with the surface of the date indicator 21.

In a case in which the hands 17a, 17b that rotate above the solar panel 5 are provided, the hands 17a, 17b are stopped in positions where they do not overlap the power generators 6a-6c in the sleep mode. Therefore, the solar panel 5 efficiently generates power without being affected by shadows of the hands 17a, 17b and the like.

While embodiments of the present invention have been described above, the present invention is not limited to the embodiments. The present invention can be modified in various ways without departing from its scope.

Figure 6:
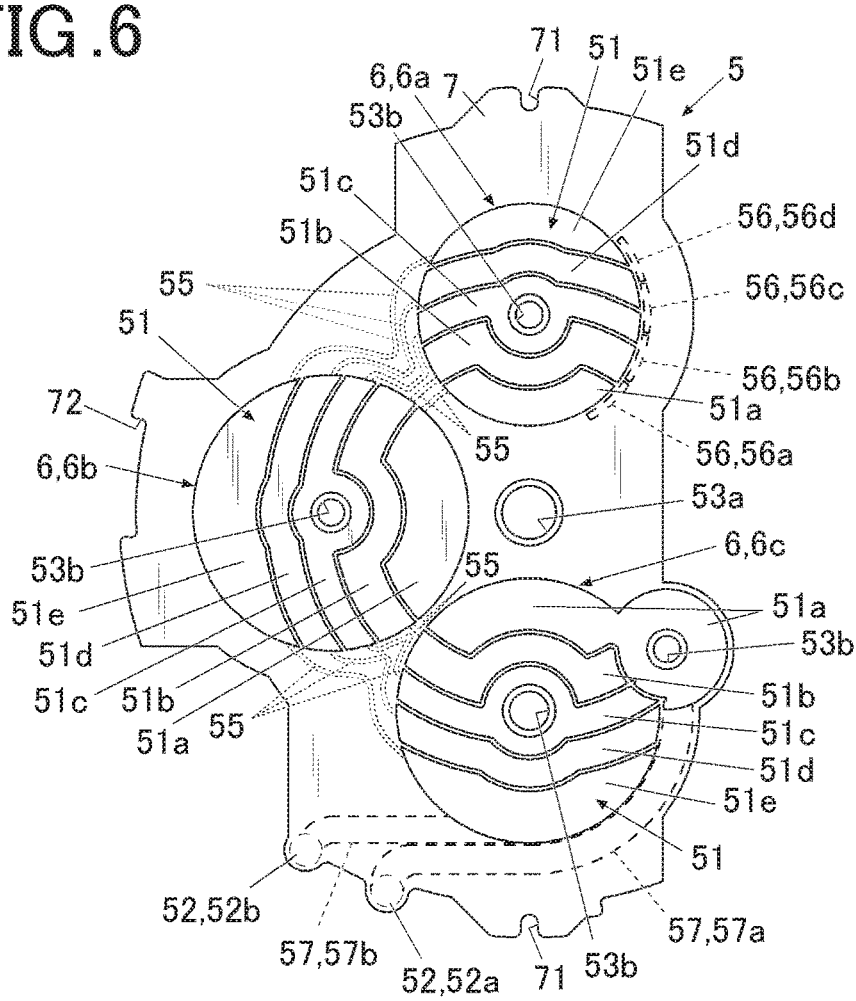
FIG. 6 is a plan view showing a modification of the solar panel.

For example, the embodiments in FIGS. 2 and 3 show an example in which the width of the solar cells 51a-51e in the portions constituting the power generators 6a-6c is the same as that in the portions constituting the connectors 55, 56. However, for example, as shown in FIG. 6, the connectors 55 and 56 (56a-56d) may be narrower than the portions constituting the power generators 6a-6c to have a shape of thin line.

The connectors 55, 56 have the shape of thin line so that the connector 55 and the connectors 56a-56d are very narrow areas and therefore do not substantially serve as power generators, although the transparent electrode 513 is not removed and the connectors 55, 56 have a mechanism of generating power by receiving light like the power generators 6a-6c.

According to this, there is no need for processing such as removing the transparent electrode 513 to replace it with the conductor layer 516. It makes manufacture easier. Since the connector 55 and the connectors 56a-56d have the shape of thin line, an area of the non-power generator 7 consisting of the base 510 and the seal 514 increases. The non-power generator 7 may be made smaller in accordance with a shape and the like of an equipment in which the solar panel 5 is installed. It makes the entire solar panel 5 smaller and lighter.

The embodiment shows an example in which the solar panel 5 includes the three power generators 6a-6c. However, the number, shape, arrangement, and the like of the power generators 6 are not limited to the examples shown in the embodiment.

Figure 7:
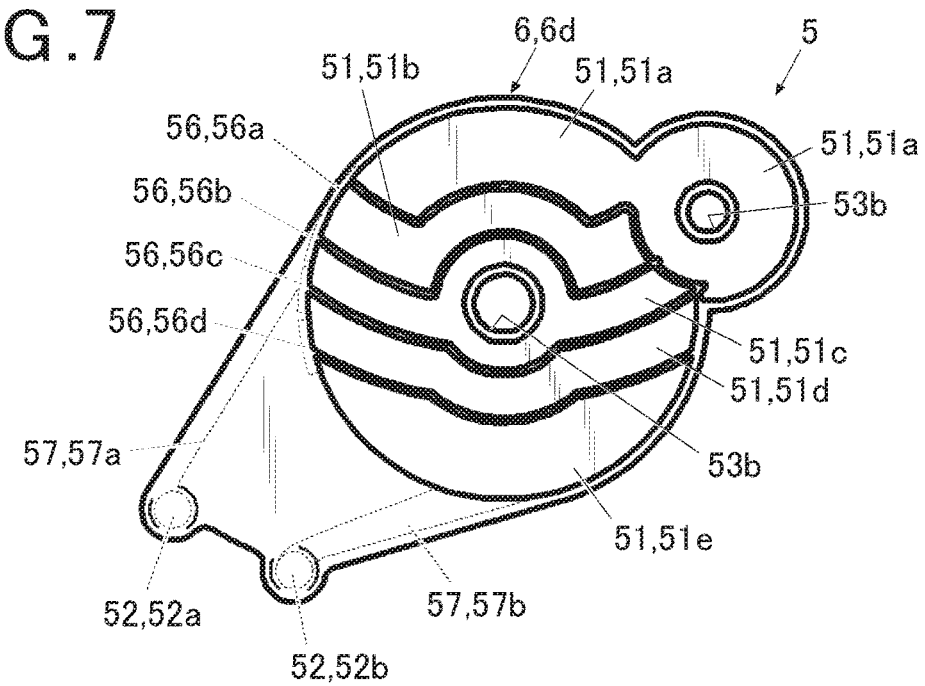
FIG. 7 is a plan view showing a modification of the solar panel.

For example, as shown in FIG. 7, the solar panel 5 may include just one power generator 6d.

Also in this case, in order to disperse effect of shadows casted on the power generator 6d by the main hands 17a and the sub hands 17b rotating above the power generator 6d, the power generator 6d preferably consists of divided solar cells 51 (e.g., five solar cells 51a-51e). This reduces effect of shadows of the hands on power generation efficiency as much as possible.

In order to increase power generation efficiency as much as possible, the solar cells 51 preferably have substantially the same area so that output currents of the solar cells 51a-51e are substantially the same. It is similar to the case in which multiple power generators 6 are provided.

The manner of dividing the solar cells 51 is not limited to the example described herein. The solar cells 51 may be divided into various shapes, such as a spiral or concentric circles, as long as effect of shadows of the hands on power generation efficiency is suppressed.

In a case in which the power generator 6d consists of the five solar cells 51a-51e, the connectors 56a-56d connect the solar cells 51a-51e in series like the example shown in the embodiment.

When the solar panel 5 is installed in an equipment, the terminal 52a on the side of the solar cell 51a, which is connected to the solar cell 51a, is electrically connected to the positive electrode on the base plate via the connector 57a. The terminal 52b on the side of the solar cell 51e, which is connected to the solar cell 51e via the connector 57b, is electrically connected to the negative electrode on the base plate.

The power generator 6d is provided corresponding to the highly transparent area of the dial 16, such as opening 181 corresponding to the face of inner dial 18. In a case in which the highly transparent area is far from the rim of the dial 16, the positive and negative electrodes on the base plate may be provided at positions near the portion where the highly transparent area is disposed, rather than around the rim of the module 2.

In this case, the connectors 24a, 24b connecting the positive and negative electrodes on the base plate and the terminals 52a, 52b of the solar panel 5 are not covered by the dial cover 163. However, in a case in which the dial 16 is made of a material that does not transmit light, such as metal, a pressure mark or the like made by the connectors 24a, 24b is not visible from the display side and does not affect the appearance, although portions corresponding to the connectors 24a, 24b are not covered by the dial cover 163 or the like.

In a case in which the solar panel 5 is far from the rim of the module 2, the solar panel 5 is less likely to contact the date indicator 21 or the like. Some warp or bend may be acceptable. It allows a configuration in which a boss or the like is provided on the module so that the solar panel 5 is cantilevered on it.

The solar panel 5 may be supported by the dial 16 according to the configuration shown in FIG. 5C and FIG. 5D, or the like.

The embodiment shows an example in which the solar cells 51a-51e of the solar panel 5 are amorphous silicon-based solar panels that include the semiconductor layer 512 made of amorphous silicon (a-Si:H) and the like. However, configuration of the solar panel 5 is not limited thereto.

For example, a gallium-based (thin-film crystalline) solar panel that generates power with a compound semiconductor made of two materials of gallium (Ga) and arsenic (As) may be applied.

In this case, nearly five times power generation efficiency of that of the amorphous silicon-based solar panel is realized. For example, if there is the opening 181 for just one inner dial, the solar panel 5 supplies power sufficient for the entire timepiece 100.

The embodiment exemplifies a configuration in which the solar panel 5 is positioned and fixedly supported on three points on the sides of twelve o'clock, nine o'clock, and six o'clock in the analog timepiece. However, a configuration in which the solar panel 5 is positioned and fixedly supported is not limited to the shown example.

For example, in a case in which the solar panel 5 is even smaller and lighter than the example, interference to surrounding members due to warp or bend is reduced even if it is not fixedly supported on three points. In that case, the solar panel 5 may be fixed by being cantilevered on one or two points.

In particular, in a case in which the solar panel 5 has the power generator 6 (e.g., the power generator 6d in FIG. 7) having an area considerably smaller than the entire dial 16, such as the case of the aforementioned gallium-based (thin film crystalline) solar panel 5, the solar panel 5 may not be fixed bridging over the module 2 or the date indicator 21. A locking protrusion or the like may be provided around the inner dial having the opening 181, which is the highly transparent area, so that the solar panel 5 is cantilevered on one point.

In a case in which the small solar panel 5 (e.g., the solar panel 5 in FIG. 7) as described above is installed in the timepiece 100, a hollow in which the solar panel 5 is disposed may be formed, for example, at a position corresponding to the solar panel 5 on the surface of the module 2 facing the dial 16. When installed, the solar panel 5 is accommodated in the hollow so that the surfaces of the solar panel 5 and the module 2 are substantially on the same plane.

In this case, the solar panel 5 does not need to be floated between the module 2 and the dial 16 avoiding the date indicator 21 and the like. Therefore, there is no need to worry about warp and bend of the solar panel 5. The solar panel 5 is positioned only by being accommodated in the hollow, which eliminates the need for fixation members and assembly.

Figure 8:
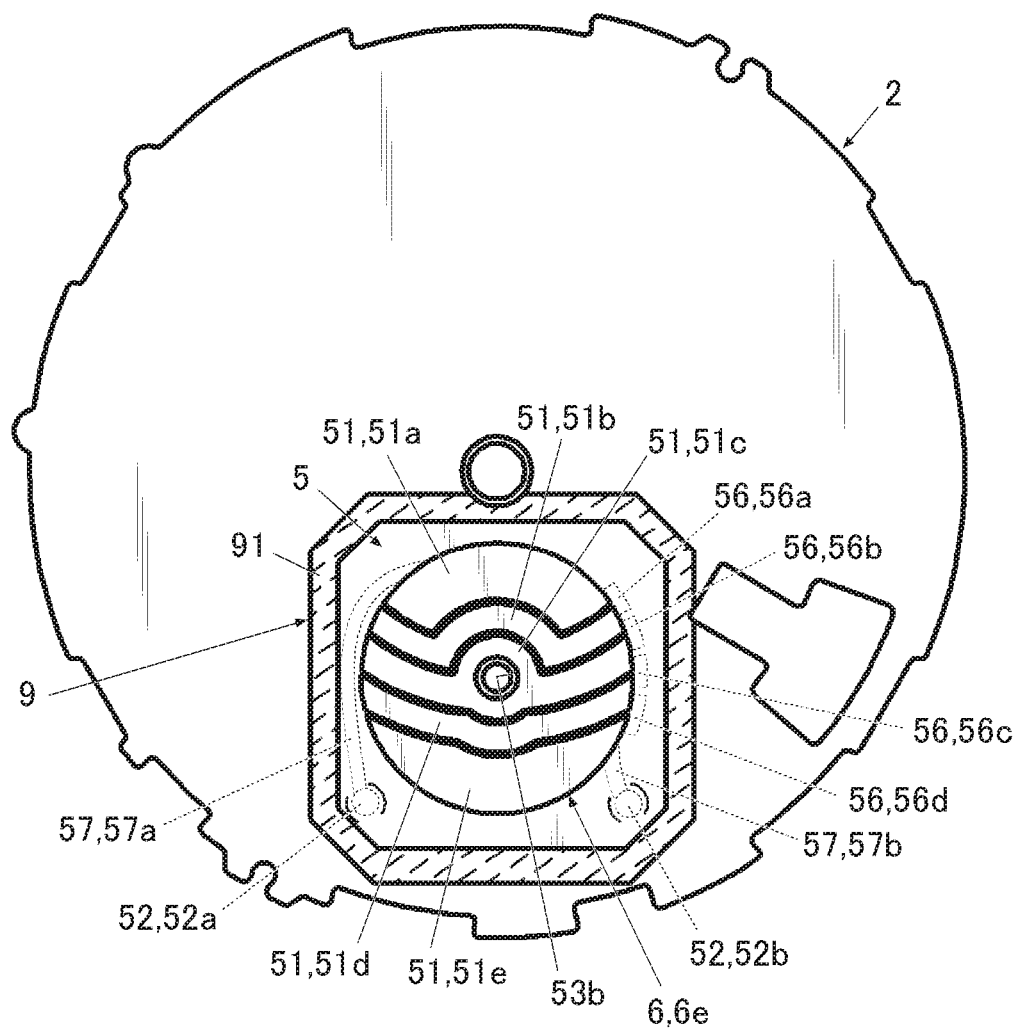
FIG. 8 is a plan view showing an example in which a modification of the solar panel is positioned on a GPS antenna.

The timepiece 100 may be provided with, for example, an antenna device that receives radio waves (e.g., a GPS antenna 9 shown in FIG. 8).

The GPS antenna 9 receives a GPS radio wave (i.e., radio wave including time information and the like transmitted from a GPS satellite) which is a microwave of a circularly polarized wave. For example, a patch antenna is preferably used. FIG. 8 shows an example in which the GPS-antenna 9 includes a radiation electrode 91 having a substantially square shape.

As shown in FIG. 8, in a case in which the GPS antenna 9 is provided on the module 2 and the solar panel 5 is a small one with one power generator 6e like the solar panel 5 shown in FIG. 7, the solar panel 5 may be piled on the GPS antenna 9.

A radiation pattern of the GPS antenna 9 which is a circularly polarized antenna spreads from an end (rim) of the radiation electrode 91.

In a case in which the radiation electrode 91 has a substantially square shape like the GPS antenna 9 shown in FIG. 8, a radiation pattern spreading from each side (rim) greatly affects antenna characteristics (radio wave reception performance of an antenna) of the GPS antenna 9 as a circularly polarized antenna.

In order to improve the antenna characteristics of the GPS antenna 9, it is essential not to inhibit the spread of the radiation pattern from each side of the radiation electrode 91.

In a case in which the solar panel 5 is piled on the GPS antenna 9, it is preferable that the solar panel 5 is disposed substantially at the center of the radiation electrode 91 of the GPS antenna 9 as shown in FIG. 8, so as not to overlap the end (rim) of the radiation electrode 91.

With this configuration, a timepiece including the GPS antenna 9 that acquires time information and the solar panel that receives light to generate power is compactly installed in a timepiece in a good condition without sacrificing either of antenna characteristics of the GPS antenna 9 and power generation efficiency of the solar panel 5.

Although the embodiment shows an example in which the timepiece 100 is an analog timepiece that includes the three inner dials 18, the configuration of the display 15 of the timepiece 100 and the like are not limited to the examples shown in figures.

For example, the position and the number of the inner dials 18 are appropriately set according to a design and the like of the timepiece 100.

The display 15 may be a digital display including a liquid crystal panel or the like.

The display 15 may include both an analog display including the main hands 17a and a digital display including a liquid crystal panel.

The embodiment shows an example in which:
the dial 16 itself is made of a material that does not transmit light such as metal;
only the openings 181 are the highly transparent areas (light transmittance of substantially 100%); and
the other part is the less transparent area (light transmittance of substantially 0%).

However, a material of the dial 16 is not limited to a material that does not transmit light.

For example, the dial 16 may be made of a resin material or the like which has a light transmittance of about 10% in a thick portion and has a light transmittance of about 30% in a thin portion.

In this case, the thin portion is the highly transparent area while the thick portion is the less transparent area. The power generator 6 of the solar panel 5 is disposed in a portion corresponding to the thin portion.

The embodiment illustrates an example in which the power generator 6 is exposed from the opening 181, but the highly transparent area is not limited to a portion where the power generator 6 is exposed.

A light transmittance of about 30% is sufficient for the power generator 6 to generate power.

It allows an example in which:
the dial 16 itself is made of a material that does not transmit light such as metal;
a small dial made of a resin material having a light transmittance of about 30% is fitted into the opening 181 of the inner dial 18; and
the power generator 6 of the solar panel 5 is disposed in a portion corresponding to the small dial.

In this case, since the entire dial 16 and the small dial of the inner dial 18 are made of different materials, the timepiece has appearance of an excellent design.

The embodiment shows an example in which the solar panel 5 is installed in the timepiece 100, but an equipment in which the solar panel 5 is installed is not limited to the timepiece 100.

The solar panel 5 can be widely applied to equipments that operate on power generated by the solar panel 5 as a drive source, such as:
biological information display devices such as pedometers, heart rate meters, and pulse meters; and
display devices that display various kinds of information such as a travel distance, travel pace information, altitude information, and atmospheric pressure information.

While several embodiments of the invention have been described above, the scope of the invention is not limited to the embodiments described above. The invention encompasses the scope of the invention as set forth in the claims and its equivalents.

INDUSTRIAL APPLICABILITY

The present invention is utilized in a solar panel and a display device and a timepiece having a solar panel.

REFERENCE SIGNS LIST 2 module
5 solar panel
6a-6c power generator
16 dial
17a, 17 hand
18 inner dial
21 date indicator
22 boss
23 protrusion
24 connector
51a-51e solar cell
55 connector
56a-56d connector
100 timepiece
181 opening
Ar1-ar3 highly transparent area

The invention claimed is:

1. A timepiece comprising:
a solar panel comprising:
power generation areas including power generators; and
a connection area which connects the power generation areas, which generates a smaller amount of power than the power generation areas generate, and which is a linear narrow area narrower than the power generation areas; and
a hand rotated above the solar panel,
wherein, in a sleep mode, the hand stops at a position where the hand does not overlap the power generation areas.

2. The timepiece according to claim 1, wherein the connection area electrically connects adjacent ones of the power generators.

3. A timepiece comprising:
a solar panel comprising:
power generators; and
a connection area which connects the power generators, which generates a smaller amount of power than the power generators generate, and which is a linear narrow area narrower than the power generators; and
a hand rotated above the solar panel,
wherein each of the power generators includes solar cells,
wherein the connection area connects each of the solar cells of the power generators disposed side by side, and
wherein, in a sleep mode, the hand stops at a position where the hand does not overlap the power generators.

4. The timepiece according to claim 3, further comprising:
a dial; and
a module disposed under the dial,
wherein the dial includes:
highly transparent areas having high optical transparency; and
a less transparent area having lower optical transparency than the highly transparent areas have,
wherein the highly transparent areas are disposed to correspond to areas where the power generators are disposed, and
wherein the less transparent area is disposed to correspond to an area where the connection area is disposed.

5. The timepiece according to claim 4, wherein:
the highly transparent area is a cut-out formed by cutting out a portion of the dial, and
the power generator of the solar panel is exposed from the cut out.

6. The timepiece according to claim 5, wherein the less transparent area of the dial is made of a material that has transmittance of substantially zero.

7. The timepiece according to claim 4, wherein:
the dial comprises a position-fixing member that positions and fixes the solar panel, and
the position-fixing member positions and fixes the solar panel on the dial.

8. The timepiece according to claim 4, further comprising:
a date indicator which is disposed between the solar panel and the module and which has a ring shape along a rim of the module,
wherein the solar panel is fixed and supported on at least three points in the rim of the module.

9. A timepiece comprising:
a solar panel comprising:
power generators which are disposed apart from each other; and
a connection area which connects the power generators and which generates a smaller amount of power than the power generators generate; and
a hand rotated above the solar panel,
wherein, in a sleep mode, the hand stops at a position where the hand does not overlap the power generators.

10. The timepiece according to claim 9, wherein the connection area is narrower than the power generators.

11. The timepiece according to claim 10, wherein the connection area electrically connects adjacent ones of the power generators disposed apart from each other.

* * * * *